US012395763B2

(12) United States Patent
Kang et al.

(10) Patent No.: US 12,395,763 B2
(45) Date of Patent: Aug. 19, 2025

(54) ANALOG-DIGITAL CONVERTING CIRCUIT INCLUDING COMPARATOR, AND IMAGE SENSOR INCLUDING THE ANALOG-DIGITAL CONVERTING CIRCUIT

(71) Applicant: Samsung Electronics Co., Ltd., Suwon-si (KR)

(72) Inventors: Sunyool Kang, Suwon-si (KR); Haesick Sul, Suwon-si (KR); Yunhwan Jung, Suwon-si (KR); Yongjun Cho, Suwon-si (KR); Heesung Chae, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 120 days.

(21) Appl. No.: 18/354,162

(22) Filed: Jul. 18, 2023

(65) Prior Publication Data

US 2024/0048870 A1 Feb. 8, 2024

(30) Foreign Application Priority Data

Aug. 5, 2022 (KR) .................. 10-2022-0098123
Nov. 2, 2022 (KR) .................. 10-2022-0144622

(51) Int. Cl.
*H04N 25/772* (2023.01)
*H03M 1/12* (2006.01)
*H03M 1/34* (2006.01)

(52) U.S. Cl.
CPC ........ *H04N 25/772* (2023.01); *H03M 1/1205* (2013.01); *H03M 1/34* (2013.01)

(58) Field of Classification Search
None
See application file for complete search history.

(56) References Cited

U.S. PATENT DOCUMENTS 8,258,816 B2   9/2012  Forbes
9,178,503 B2  11/2015  Hsieh
(Continued)

FOREIGN PATENT DOCUMENTS

CN        103546127 A      1/2014
KR        10-1948057       2/2019
KR     10-2021-0150594 A  12/2021

OTHER PUBLICATIONS

Extended European Search Report dated Nov. 15, 2023 for corresponding European Application No. 23187281.3.
(Continued)

*Primary Examiner* — Mark T Monk
(74) *Attorney, Agent, or Firm* — Harness, Dickey & Pierce, P.L.C.

(57) ABSTRACT

Provided are analog-digital converting circuits including a comparator, and an image sensor. The analog-digital converting circuit include a counter and a comparator, the comparator including a first P-type transistor including a gate connected to a first input node of the comparator, a second P-type transistor including a gate connected to a second input node of the comparator, a first N-type transistor including a gate connected to the first input node and a drain connected to the first P-type transistor, a second N-type transistor including a gate connected to the second input node and a drain connected to the second P-type transistor, and a transistor including a gate connected to the drain of the first N-type transistor and a source to which ground voltage or power supply voltage is applied.

20 Claims, 15 Drawing Sheets

(56) References Cited

U.S. PATENT DOCUMENTS

| | | |
|---|---|---|
| 9,191,599 B2 | 11/2015 | Park et al. |
| 10,536,143 B1 | 1/2020 | Price et al. |
| 11,025,853 B2 | 6/2021 | Ogawa et al. |
| 2011/0068829 A1 | 3/2011 | Ogawa et al. |
| 2012/0194252 A1* | 8/2012 | Rysinski ............ H03K 5/2481 327/307 |
| 2017/0250661 A1 | 8/2017 | Imaizumi |
| 2020/0162067 A1 | 5/2020 | Kim |
| 2020/0280693 A1 | 9/2020 | Kim |
| 2021/0250530 A1 | 8/2021 | Paik et al. |
| 2022/0014691 A1 | 1/2022 | Bosset et al. |
| 2022/0060647 A1 | 2/2022 | Lee et al. |
| 2022/0116564 A1 | 4/2022 | Paik et al. |
| 2022/0209729 A1 | 6/2022 | Lim et al. |
| 2022/0224853 A1 | 7/2022 | Berner et al. |

OTHER PUBLICATIONS

Lee Ilseop et al: "A Low-Power Incremental Delta-Sigma ADC for CMOS Image Sensors", IEEE Transactions On Circuits and Systems II: Express Briefs, IEEE, USA, vol. 63, No. 4, Apr. 1, 2016 (Apr. 1, 2016), pp. 371-375, XP011604504, ISSN: 1549-7747, DOI: 10.1109/TCSII.2015.2503706 [retrieved on Mar. 2016.

Bazes M: "Two Novel Fully Complementary Self-Biased CMOS Differential Amplifiers", IEEE Journal of Solid-State Circuits, IEEE, USA, vol. 26, No. 2, Feb. 1, 1991 (Feb. 1, 1991), pp. 165-168, XP000203311, ISSN: 0018-9200, DOI: 10.1109/4.68134.

* cited by examiner

ANALOG-DIGITAL CONVERTING CIRCUIT INCLUDING COMPARATOR, AND IMAGE SENSOR INCLUDING THE ANALOG-DIGITAL CONVERTING CIRCUIT

CROSS-REFERENCE TO RELATED APPLICATION

This application is based on and claims priority under 35 U.S.C. § 119 to Korean Patent Application No. 10-2022-0098123, filed on Aug. 5, 2022, in the Korean Intellectual Property Office, and Korean Patent Application No. 10-2022-0144622, filed on Nov. 2, 2022, in the Korean Intellectual Property Office, the disclosures of which are incorporated by reference herein in their entireties.

BACKGROUND

The inventive concepts relates to image sensors, and more particularly, to analog-digital converting circuits including a comparator, and image sensors including the analog-digital converting circuit.

Image sensors are used to captures two-dimensional or three-dimensional images of objects. An image sensor may generate an image of an object by using a photoelectric conversion element that operates according to the intensity of light reflected from the object. Owing to the recent development of complementary metal oxide semiconductor (CMOS) techniques, CMOS image sensors have been widely used. Correlated double sampling (CDS) is used to remove reset noise of pixels of CMOS image sensors. Analog-digital converting circuits using CDS techniques are required to have high performance for image quality improvements.

SUMMARY

The inventive concepts provide analog-digital converting circuits including a comparator with reduced noise level, and image sensors including the analog-digital converting circuit.

According to some aspects of the inventive concepts, there is provided an analog-digital converting circuit including a comparator and a counter, wherein the comparator includes a first P-type transistor including a gate connected to a first input node of the comparator, a second P-type transistor including a gate connected to a second input node of the comparator, a first N-type transistor including a gate connected to the first input node and a drain connected to the first P-type transistor, a second N-type transistor including a gate connected to the second input node and a drain connected to the second P-type transistor, and a transistor including a gate connected to the drain of the first N-type transistor and a source to which ground voltage or power supply voltage is applied.

According to some aspects of the inventive concepts, there is provided an image sensor including a pixel array including a plurality of pixels, a ramp generator configured to generate a ramp signal, and an analog-digital converting circuit configured to convert a pixel signal output from the pixel array into a digital signal, the analog-digital converting circuit including a comparator and a counter, wherein the comparator includes a first P-type transistor including a gate connected to a first input node receiving the ramp signal, a second P-type transistor including a gate connected to a second input node receiving the pixel signal, a first N-type transistor including a gate connected to the first input node, a second N-type transistor including a gate connected to the second input node, and a transistor including a gate connected to a drain of the first N-type transistor and a source to which ground voltage or power supply voltage is applied.

According to some aspects of the inventive concepts, there is provided an image sensor including a pixel array having a plurality of pixels connected to a plurality of column lines, a ramp generator configured to generate a ramp signal, and a plurality of analog-digital converting circuits each including a first comparator and a second comparator that are configured to generate a comparison result signal by comparing a pixel signal output through a corresponding column line among the plurality of column lines with the ramp signal, wherein the first comparator includes a first P-type transistor and a first N-type transistor that receive the ramp signal, a second P-type transistor and a second N-type transistor that receive the pixel signal, a first output node through which results of the comparing of the pixel signal with the ramp signal are output as a first output signal, a second output node through which a second output signal is output, and a transistor including a gate connected to the second output node and a source to which ground voltage or power supply voltage is applied.

BRIEF DESCRIPTION OF THE DRAWINGS

Example embodiments will be more clearly understood from the following detailed description taken in conjunction with the accompanying drawings in which.

DETAILED DESCRIPTION

Hereinafter, example embodiments will be described with reference to the accompanying drawings.

Figure 1:
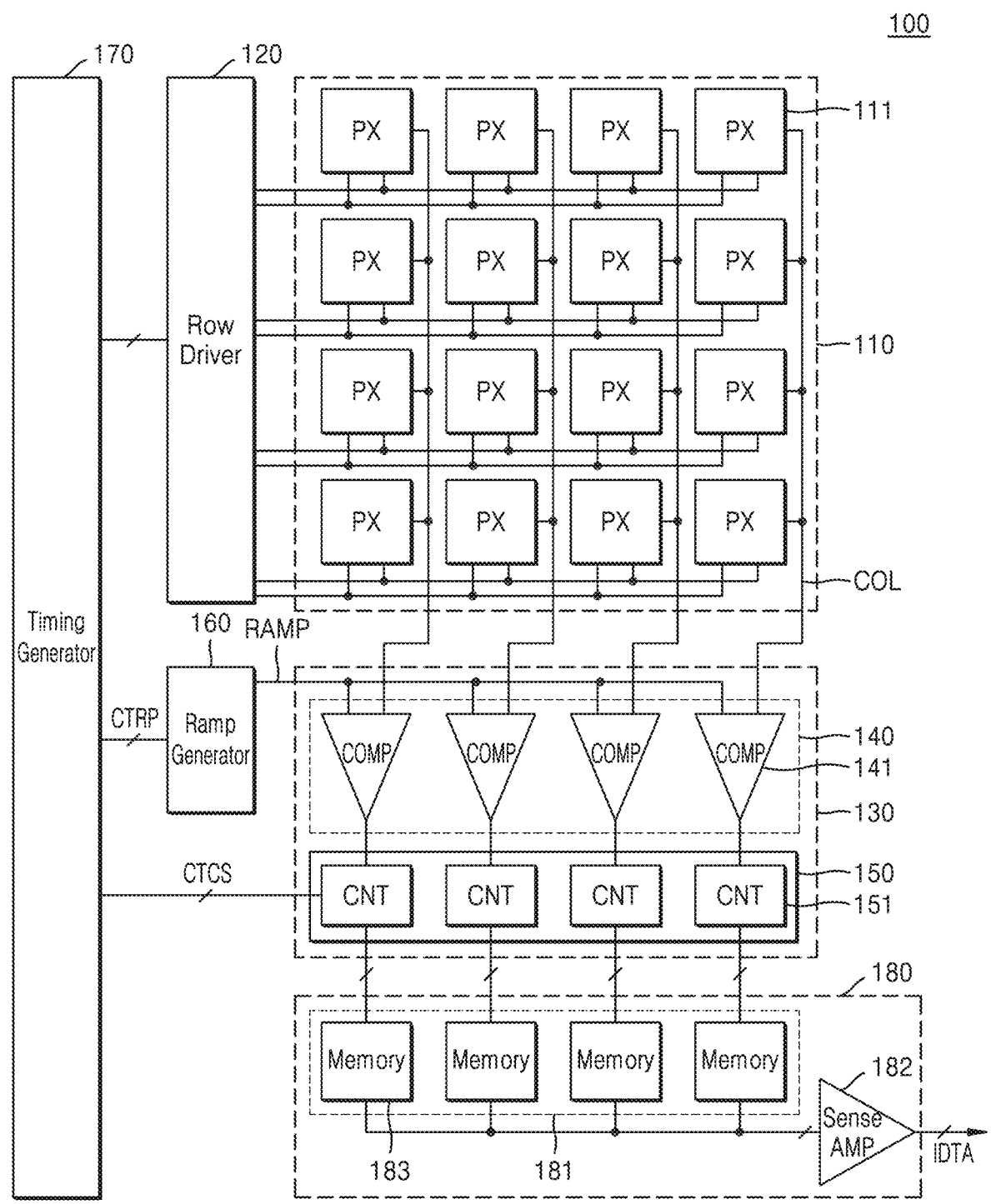
FIG. 1 is a block diagram illustrating an image sensor according to some example embodiments.

FIG. 1 is a block diagram illustrating an image sensor 100 according to some example embodiments.

The image sensor 100 may be included in an electronic device having an image or light sensing function. For example, the image sensor 100 may be included in an electronic device such as a camera, a smartphone, a wearable device, an Internet of Things (IoT) device, a tablet personal computer (PC), a personal digital assistant (PDA), a portable multimedia player (PMP), and/or a navigation device. In addition, the image sensor 100 may be included in an electronic device that is a part of a vehicle, a piece of furniture, a manufacturing facility, a door, a measuring device, or the like.

The image sensor 100 may include a pixel array 110, a row driver 120, an analog-digital converter (ADC) 130, a ramp generator 160, a timing generator 170, and a buffer 180.

The pixel array 110 includes a plurality of pixels 111 arranged in a matrix form and each connected to a plurality of row lines and a plurality of column lines COL. Each of the pixels 111 includes a light sensing element. For example, the light sensing device may include a photodiode, a phototransistor, a photogate, and/or a pinned photodiode. Each of the pixels 111 may include at least one light sensing element, and in some example embodiments, each of the pixels 111 may include a plurality of light sensing elements.

Figure 2:
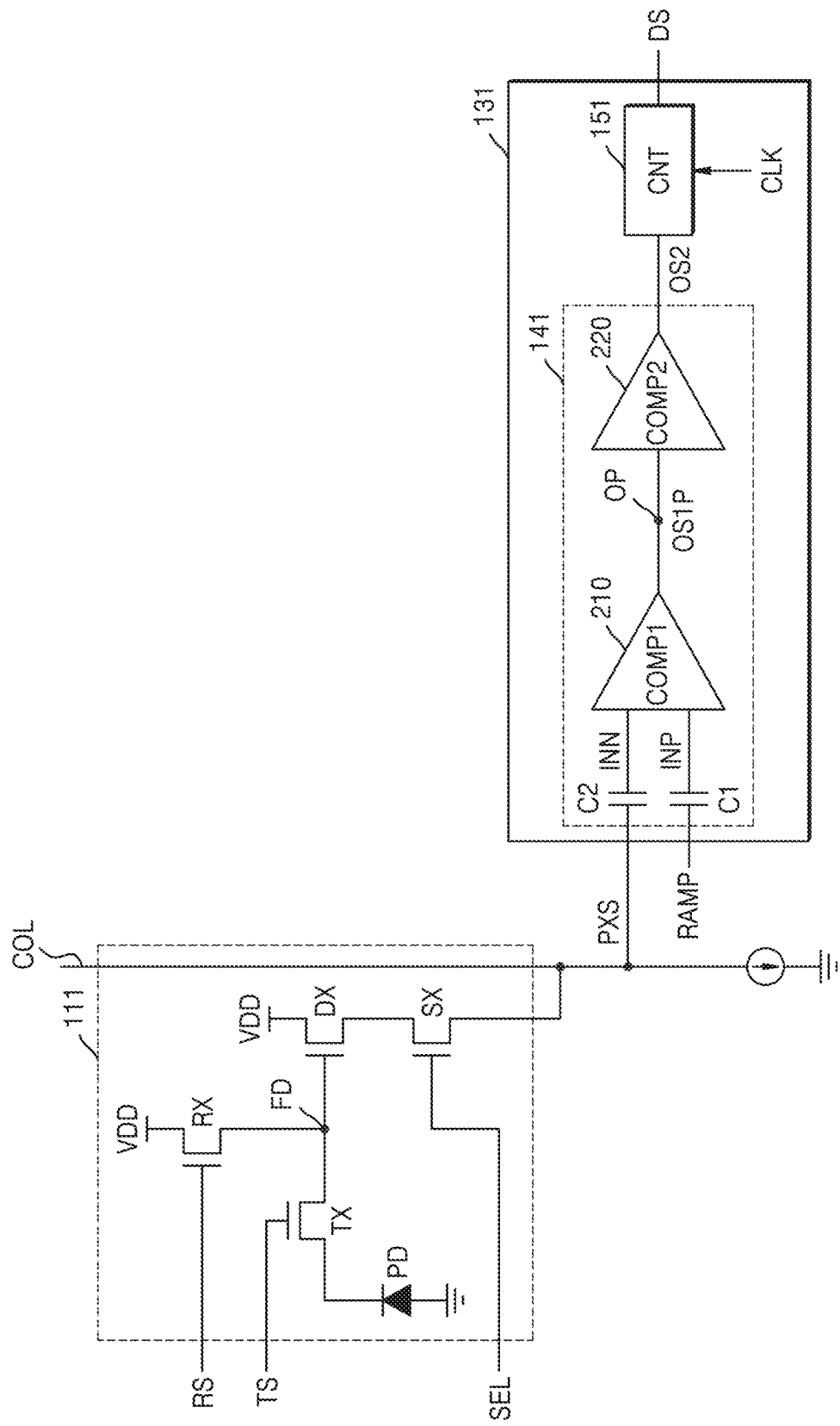
FIG. 2 is a block diagram illustrating a pixel included in the image sensor, and a column parallel analog-digital converting circuit (ADC) connected to the pixel, according to some example embodiments.

Each of the pixels 111 may sense light by using the light sensing element and may convert the sensed light into an electrical pixel signal PXS (refer to FIG. 2). The pixel signal PXS may include a reset signal generated according to a reset operation of each of the pixels 111, and an image signal generated according to a light sensing operation of each of the pixels 111.

Each of the pixels 111 may sense light in a specific spectrum region. For example, the pixels 111 may include red pixels each configured to convert light in a red spectrum region into an electrical signal, green pixels each configured to convert light in a green spectrum region into an electrical signal, and blue pixels each configured to convert light in a blue spectrum region into an electrical signal. A color filter configured to transmit light in a specific spectrum region may be disposed above each of the pixels 111.

The timing generator 170 may output a control signal or a clock signal to the row driver 120, the ADC 130, and the ramp generator 160 to control the operations or timing of the row driver 120, the ADC 130, and the ramp generator 160.

The row driver 120 may drive the pixel array 110 in units of rows. The row driver 120 may decode a row control signal (for example, an address signal) generated by the timing generator 170 and, may select at least one of the row lines of the pixel array 110 in response to the decoded row control signal. For example, the row driver 120 may generate a row selection signal. The pixel array 110 may output a pixel signal PXS through a row line selected by a row selection signal provided from the row driver 120.

The ADC 130 may convert a pixel signal PXS, which is an analog signal received from the pixel array 110, into a digital signal. The ADC 130 may include a comparison block 140 and a counter block 150.

The comparison block 140 may include a plurality of comparison circuits 141, and each of the comparison circuits 141 may be connected to at least one corresponding column line COL among the column lines COL. Each of the comparison circuits 141 may receive a ramp signal RAMP from the ramp generator 160 and may compare the ramp signal RAMP with a pixel signal PXS output from a pixel 111 connected to a column line COL. The counter block 150 may include a plurality of counters 151.

That is, each of the comparison circuits 141 may receive a pixel signal PXS through at least one corresponding column line COL among the column lines COL and a ramp signal RAMP from the ramp generator 160, and may output a comparison result signal by comparing the pixel signal PXS and the ramp signal RAMP with each other. Each of the comparison circuits 141 and the counters 151 may be referred to as a correlated double sampling (CDS) circuit capable of CDS, particularly, as a column parallel CDS circuit. Pixel signals PXS output from the pixels 111 may have a deviation caused by pixel-specific characteristics of the pixels 111 and/or a deviation caused by different logic characteristics for outputting pixel signals from the pixels 111. To compensate for such deviations between pixel signals PXS, CDS may be performed by calculating a reset component (or a reset signal) and an image component of each pixel signal PXS and extracting the difference between the reset component and the image component as an effective signal component.

Each of the comparison circuits 141 may include a first comparator configured to compare a pixel signal PXS and a ramp signal RAMP with each other, and a second comparator configured to amplify and output an output of the first comparator. In this case, the first comparator may have a noise-reducing circuit configuration, and thus the comparison circuit 141 may reduce noise and prevent or reduce deterioration in the quality of image data IDTA in a low-illumination environment.

The ramp generator 160 may generate a ramp signal RAMP. The ramp generator 160 may generate a ramp signal RAMP in response to a ramp control signal CTRP provided from the timing generator 170. The ramp control signal CTRP may include a ramp-enable signal and a mode signal. When the ramp-enable signal is activated, the ramp generator 160 may generate a ramp signal RAMP having a slope that is set based on the mode signal. For example, as described later with reference to FIG. 6, the ramp generator 160 may generate a ramp signal RAMP that decreases with a constant slope, or as described with reference to FIGS. 8A and 8B, the ramp generator 160 may generate a ramp signal RAMP that increases with a constant slope.

The counters 151 may be respectively connected to output terminals of the comparison circuits 141 such that counting may be performed based on an output signal (e.g., a comparison result signal) of each of the comparison circuits 141. A counter control signal CTCS may include a counter clock signal, a counter reset signal for controlling reset operations of the counters 151, and an inversion signal for inverting internal bits of each of the counters 151. The counter block 150 may count a comparison result signal according to a counter clock signal and may output results of the counting as a digital signal.

The counters 151 may include an up/down counter and a bit-wise inversion counter. In this case, the bit-wise inversion counter may perform an operation similar to that of the up/down counter. For example, the bit-wise inversion counter may have a function of performing only up-counting, and a function of inverting all internal bits of the bit-wise inversion counter in response to a certain input signal to calculate a 1's complement. After the bit-wise inversion counter performs reset counting, the bit-wise inversion counter may return a 1's complement, that is, a negative value, by inverting a result of the reset counting.

However, the image sensor 100 of the disclosure is not limited thereto. The image sensor 100 may further include a counting code generator configured to perform a count coding operation under control by the timing generator 170. The counting code generator may be implemented as a gray code generator and may generate, as a counting code, a plurality of code values having a resolution according to a set number of bits. For example, the counters 151 may include a latch circuit and an arithmetic circuit, wherein the latch circuit may receive a counting code from the counting code generator and an output signal from the comparison block 140, and may latch code values of the counting code at the time when the level of a comparison signal transits. The arithmetic circuit may calculate a reset value and an image signal value to generate an image signal value from which a reset level of a pixel 111 is removed. The counter block 150 may output, as a pixel value, the image signal value from which the reset level is removed.

The buffer 180 may temporarily store a digital signal output from the ADC 130 and may then sense, amplify, and output the digital signal. The buffer 180 may include a column memory block 181 and a sense amplifier 182, and the column memory block 181 may include a plurality of memories 183. The memories 183 may temporarily store digital signals output from the counters 151 and may output the digital signals to the sense amplifier 182, and the sense amplifier 182 may sense and amplify the digital signals output from the memories 183. The sense amplifier 182 may output the amplified digital signals as image data IDTA.

FIG. 2 is a block diagram illustrating a pixel 111 of the image sensor 100, and a column parallel ADC 131 connected to the pixel 111, according to some example embodiments. The following description will be given together with a pixel 111 of some example embodiments for ease of illustration.

Referring to FIG. 2, the pixel 111 may include a photodiode PD, a transfer transistor TX, a floating diffusion node FD, a reset transistor RX, a drive transistor DX, and a selection transistor SX. The photodiode PD may be replaced with another photoelectric conversion element.

The photodiode PD may generate photocharge according to the intensity of incident light. The transfer transistor TX may transfer the photocharge generated by the photodiode PD to the floating diffusion node FD according to a transfer control signal TS output from the row driver 120 (refer to FIG. 1). The drive transistor DX may amplify the photocharge and transfer the photocharge to the selection transistor SX according to the potential of photocharge accumulated in the floating diffusion node FD. A drain of the selection transistor SX may be connected to a source of the drive transistor DX, and a pixel signal PXS may be output to a column line COL according to a selection signal SEL output from the row driver 120. The reset transistor RX may reset the floating diffusion node FD to power supply voltage VDD according to a reset control signal RS provided from the row driver 120.

FIG. 2 shows that the pixel 111 has a 4-transistor (4T) structure including one photodiode PD and four transistors TX, RX, DX, and SX. However, the pixels 111 of the image sensor 100 of the inventive concepts are not limited to the structure shown in FIG. 2. The pixel 111 may have a 3-transistor (3T) structure including one photodiode PD and three transistors selected from a transfer transistor TX, a reset transistor RX, a drive transistor DX, and a selection transistor SX.

The column parallel ADC 131 may include a comparison circuit 141 and a counter 151. For ease of illustration, FIG. 2 illustrates one comparison circuit 141 and one counter 151 that are included in the column parallel ADC 131 connected to one column line COL. However, as described with reference to FIG. 1, the ADC 130 may include a plurality of column parallel ADCs 131 including a plurality of comparison circuits 141 and a plurality of counters 151 that are connected to a plurality of column lines COL.

The comparison circuit 141 may include a first comparator 210, a second comparator 220, and capacitors C1 and C2. The first comparator 210 may include a differential amplifier, and the differential amplifier may be implemented as an operational transconductance amplifier (OTA), an operational amplifier, or the like.

A first input node of the first comparator 210 may receive a ramp signal RAMP as a first input signal INP, and a second input node of the first comparator 210 may receive a pixel signal PXS as a second input signal INN. The first comparator 210 may compare the pixel signal PXS and the ramp signal RAMP that are received through the capacitors C1 and C2, and may output results of the comparison through a first output node OP as an output signal OS1P.

The second comparator 220 may amplify or invert the output signal OS1P output from the first comparator 210. For example, the second comparator 220 may be implemented as an amplifier. For example, the second comparator 220 may include a differential amplifier or an inverter. An output signal OS2 output from the second comparator 220 may be provided to the counter 151 as a comparison result signal.

The comparison circuit 141 may be initialized in response to an auto-zero signal in an auto-zero period before a comparison operation is performed. For example, the auto-zero signal may include a first auto-zero signal AZ1 (refer to FIG. 4) input to the first comparator 210, and a second auto-zero signal AZ2 (refer to FIG. 5) input to the second comparator 220.

The counter 151 may output a digital signal DS by counting the comparison result signal, that is, the output signal OS2 of the second comparator 220, based on a counting clock signal CLK. The counter 151 may transmit the digital signal DS to the buffer 180 (refer to FIG. 1).

Figure 3:
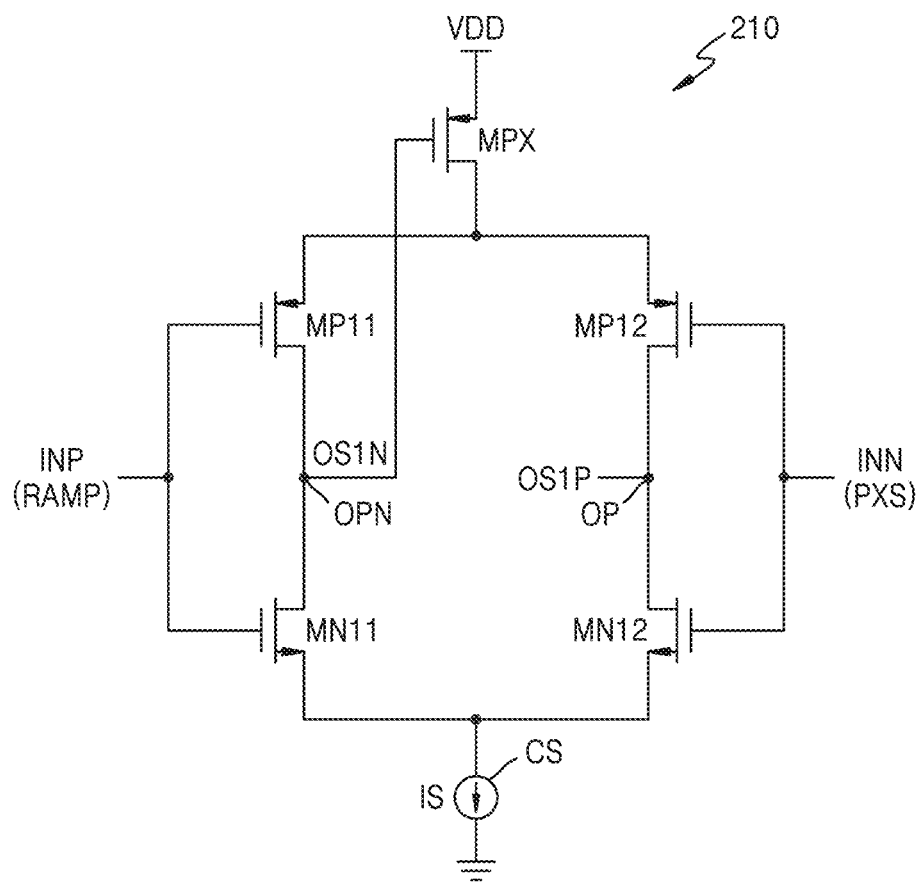
FIGS. 3 and 4 are circuit diagrams illustrating examples of a first comparator included in the ADC according to some example embodiments.
Figure 4:
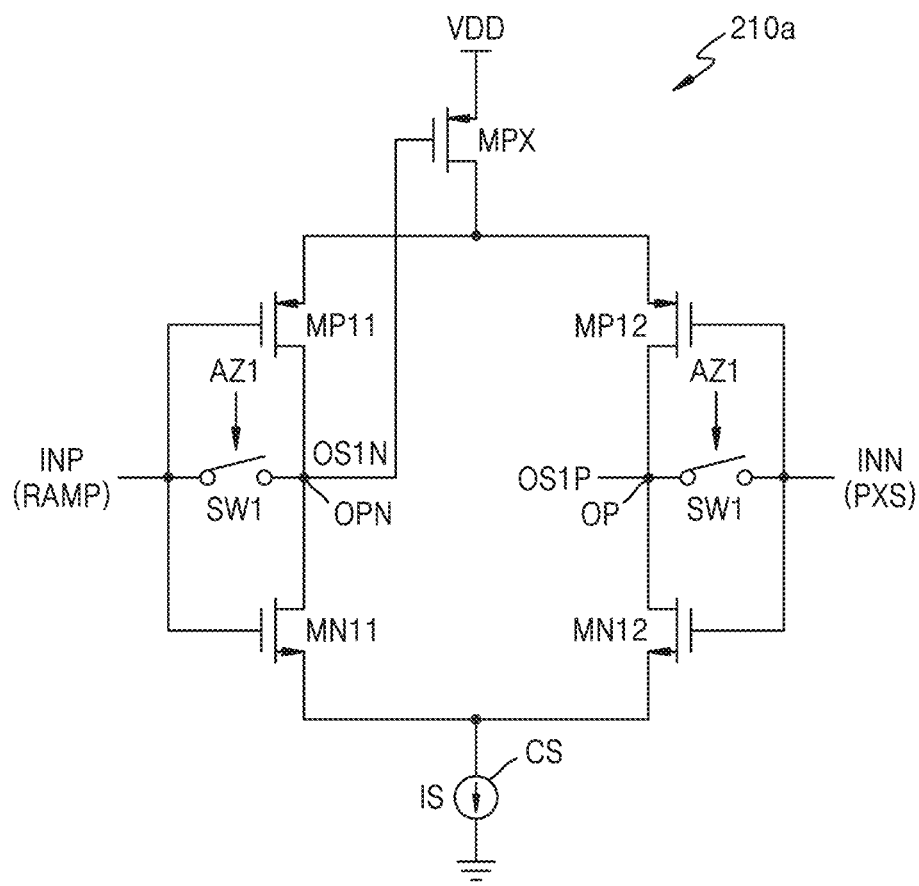

FIGS. 3 and 4 are circuit diagrams illustrating first comparators 210 and 210a as examples that may be included in the ADC 130 according to example embodiments. First output signals OS1P shown in FIGS. 3 and 4 may be the same as the output signal OS1P shown in FIG. 2.

Referring to FIG. 3, the first comparator 210 may include a plurality of transistors MP11, MP12, MN11, MN12, and MPX, and a current source CS. The first comparator 210 may include a first P-type transistor MP11, a second P-type transistor MP12, a first N-type transistor MN11, a second N-type transistor MN12, and a transistor MPX. The transistor MPX may be a P-type transistor. The first comparator 210 may be referred to as an OTA having a 6-transistor (6T) structure.

In some example embodiments, the current source CS may be implemented with an N-type metal oxide semiconductor (NMOS) transistor, that is, an N-type metal oxide semiconductor field effect transistor (MOSFET). A node of the current source CS may be connected to ground voltage, and the current source CS may generate bias current IS.

A gate of the first N-type transistor MN11 and a gate of the second N-type transistor MN12 may receive differential inputs, for example, a first input signal INP and a second input signal INN, respectively. A gate of the first P-type transistor MP11 and a gate of the second P-type transistor MP12 may receive the differential inputs, for example, the first input signal INP and the second input signal INN, respectively. For example, a ramp signal RAMP may be received as the first input signal INP, and a pixel signal PXS may be received as the second input signal INN. The first N-type transistor MN11, the second N-type transistor MN12, the first P-type transistor MP11, and the second P-type transistor MP12 may generate a differential current according to the level difference between the first input signal INP and the second input signal INN.

A source of the first P-type transistor MP11 and a source of the second P-type transistor MP12 may be connected to a first node (for example, a drain) of the transistor MPX, and power supply voltage VDD may be applied to a second node (for example, a source) of the transistor MPX. A drain of the first P-type transistor MP11 may be connected to a second output node OPN that outputs a second output signal OS1N, and a drain of the second P-type transistor MP12 may be connected to a first output node OP that outputs a first output signal OS1P. A gate of the transistor MPX may be connected to the second output node OPN.

A source of the first N-type transistor MN11 and a source of the second N-type transistor MN12 may be connected to the current source CS. A drain of the first N-type transistor MN11 may be connected to the second output node OPN that outputs the second output signal OS1N, and a drain of the second N-type transistor MN12 may be connected to the first output node OP that outputs the first output signal OS1P.

When the first input signal INP and the second input signal INN are the same, current flowing through the first N-type transistor MN11 and the first P-type transistor MP11 may be the same as current flowing through the second N-type transistor MN12 and the second P-type transistor MP12. When the first input signal INP and the second input signal INN are different from each other, current flowing through the first N-type transistor MN11 and the first P-type transistor MP11 may be different from current flowing through the second N-type transistor MN12 and the second P-type transistor MP12. The sum of currents flowing through the first N-type transistor MN11 and the second N-type transistor MN12 may be equal to the bias current IS.

The first output signal OS1P and the second output signal OS1N may be determined based on the amount of current flowing through the first N-type transistor MN11 and the second N-type transistor MN12. When the level of the first input signal INP is higher than the level of the second input signal INN, the amount of current flowing in the first N-type transistor MN11 may be greater than the amount of current flowing in the second N-type transistor MN12, such that the level of the first output signal OS1P may increase and the level of the second output signal OS1N may decrease.

In the inventive concepts, the magnitude $V_{n,in}^2$ of noise (for example, thermal noise) occurring in the second input signal INN due to the first comparator 210 may be calculated by Equation I below. In Equation 1, k refers to the Boltzmann constant, and T refers to temperature. In addition, γ refers to a constant that is related to characteristics of the transistors of the first comparator 210. In other words, γ is related to manufacturing processes of the first comparator 210. In addition, BW refers to a value determined by a bandwidth. In addition, $g_{m,in}$ refers to the transconductance of the first N-type transistor MN11 and the second N-type transistor MN12, and $g_{m,in2}$ refers to the transconductance of the first P-type transistor MP11 and the second P-type transistor MP12.

$$V_{n,in}^2 = 8kT\gamma\left(\frac{1}{g_{m,in} + g_{m,in2}}\right)\frac{\pi BW}{2} \quad \text{[Equation 1]}$$

Unlike the first comparator 210 of the inventive concepts, the magnitude $V_{n,in}^2$ of noise occurring in a second input signal INN due to a comparator of a comparative example having a current minor structure may be calculated by Equation 2 below. In Equation 2, $g_{m,in}$ refers to the transconductance of N-type transistors of the comparator of the comparative example, and $g_{m,l}$ refers to the transconductance of P-type transistors of the comparator of the comparative example.

$$V_{n,in}^2 = 8kT\gamma\left(\frac{1}{g_{m,in}} + \frac{g_{m,l}}{g_{m,in}^2}\right)\frac{\pi BW}{2} \quad \text{[Equation 2]}$$

Unlike the comparator of the comparative example, the first comparator 210 of the inventive concepts does not have a current mirror structure, that is, does not have mirror load transistors. In addition, the first comparator 210 of the inventive concepts may include P-type transistors to which the first input signal INP and the second input signal INN are input. That is, the first comparator 210 of the inventive concepts may include the first P-type transistor MP11 and the second P-type transistor MP12. Therefore, compared to the comparative example, the first comparator 210 of the inventive concepts may reduce noise occurring in the second input signal INN and may prevent or reduce deterioration of image data in a low-illumination environment.

Referring to FIG. 4, the first comparator 210a may include a plurality of transistors MP11, MP12, MN11, MN12, and MPX, and a current source CS. In addition, the first comparator 210a may further include a plurality of switching circuits SW1 and SW2. When the switching circuits SW1 and SW2 are turned on, an input node to which a second input signal INN is input may be connected to a first output node OP to which a first output signal OS1P is output, and an input node to which a first input signal INP is input may be connected to a second output node OPN to which a second output signal OS1N is output.

For example, the switching circuits SW1 and SW2 may receive a first auto-zero signal AZ1 that is for turning on the switching circuits SW1 and SW2 in an auto-zero period. The first auto-zero signal AZ1 may be received from the timing generator 170 (refer to FIG. 1). When the switching circuits SW1 and SW2 are turned on, the voltage levels of the first input signal INP, the second input signal INN, the first output signal OS1P, and the second output signal OS1N may become equal to each other, and at this time, the voltage levels of the first input signal INP, the second input signal INN, the first output signal OS1P, and the second output signal OS1N may be referred to as an auto-zero voltage. In addition, for example, in a comparison operation period in which the first comparator 210a performs a comparison operation, the switching circuits SW1 and SW2 may be turned off.

Figure 5:
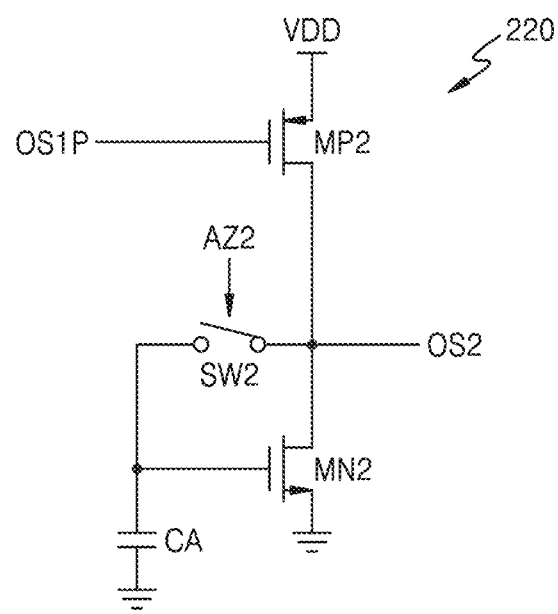
FIG. 5 is a circuit diagram illustrating an example of a second comparator included in the ADC according to some example embodiments.

FIG. 5 is a circuit diagram illustrating a second comparator 220 as an example that may be included in the ADC 130 according to some example embodiments. A first output signal OS1P shown in FIG. 5 may be the same as the output signal OS1P shown in FIG. 2.

Referring to FIG. 5, the second comparator 220 may include a plurality of transistors MP2 and MN2, a switching circuit SW2, and a capacitor CA. The first output node OP of the first comparator 210 may be connected to a gate of the P-type transistor MP2 of the second comparator 220, and a first output signal OS1P of the first comparator 210 may be input to the second comparator 220 as an input signal. Power supply voltage VDD may be applied to a source of the P-type transistor MP2, and a drain of the P-type transistor MP2 may be connected to an output node to which an output signal OS2 of the second comparator 220 is output.

A drain of the N-type transistor MN2 may be connected to the output node of the second comparator 220, and ground voltage may be applied to a source of the N-type transistor MN2. That is, the P-type transistor MP2 and the N-type transistor MN2 may be connected in series to each other. The N-type transistor MN2 may operate as a current source and may generate bias current based on voltage at a node of the capacitor CA.

Figure 6:
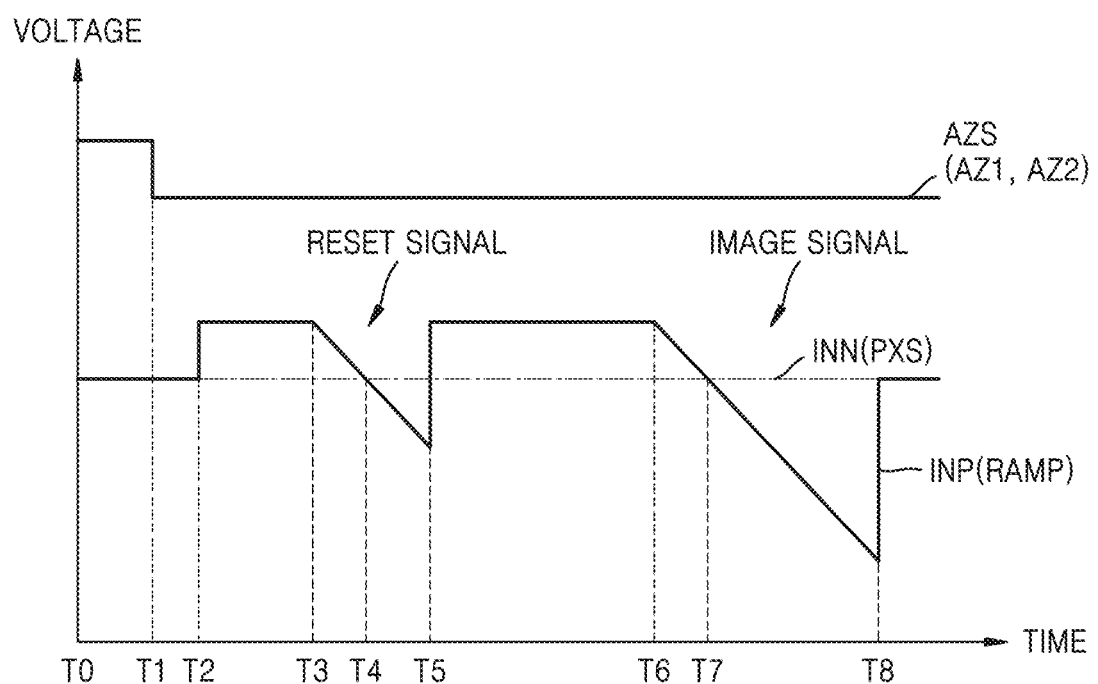
FIG. 6 is a timing diagram illustrating signals input to a comparison circuit shown in FIG. 2 to explain an operation of the ADC shown in FIG. 2.

FIG. 6 is a timing diagram illustrating signals input to the comparison circuit 141 shown in FIG. 2 to explain an operation of the column parallel ADC 131 shown in FIG. 2.

Referring to FIGS. 2 and 6, a period from time T0 to time T1 may be defined as an auto-zero period, and a period from time T1 to time T8 may be defined as a comparison operation period. An auto-zero signal AZS (for example, the first auto-zero signal AZ1 shown in FIG. 4 and the second auto-zero signal AZ2 shown in FIG. 5) may be active from time T0 to time T1, and the comparison circuit 141 may be initialized in response to the auto-zero signal AZS. The input nodes and/or output nodes of the first comparator 210 and the second comparator 220 may have the same level.

For digital conversion of a reset signal, an offset may be applied to a ramp signal RAMP at time T2, and then the ramp signal RAMP may decrease from time T3 to time T5. The counter 151 may count a counting clock signal CLK during a period from time T3 to time T4 in which the polarity of an output signal OS2 of the second comparator 220 changes.

After the digital conversion of the reset signal is completed, an offset may be applied to the ramp signal RAMP again at time T5 to convert an image signal into a digital signal at time T5. After time T5, the transfer transistor TX may be turned on, and a second input signal INN to the first comparator 210 may vary due to a charge accumulated in the photodiode PD during an exposure time. In FIG. 6, for ease of illustration, it is assumed that the second input signal INN to the first comparator 210 does not vary because photocharge generated by the photodiode PD is not accumulated.

For digital conversion of an image signal, the ramp signal RAMP may decrease during a period from time T6 to time T8. The counter 151 may count the counting clock signal CLK during the period from time T6 to time T7 in which the polarity of the output signal OS2 of the second comparator 220 changes. To perform a next read operation, an offset may be applied to the ramp signal RAMP again at time T8.

When the digital conversion of an image signal of a specific pixel is completed, the column parallel ADC 131 may be initialized to perform correlated double sampling on a next pixel. Variations of the signals shown in FIG. 6 are examples, and the timing of each of the signals may be modified depending on a method of implementing the column parallel ADC 131, for example, the structures of the first comparator 210 and the second comparator 220.

Figure 7:
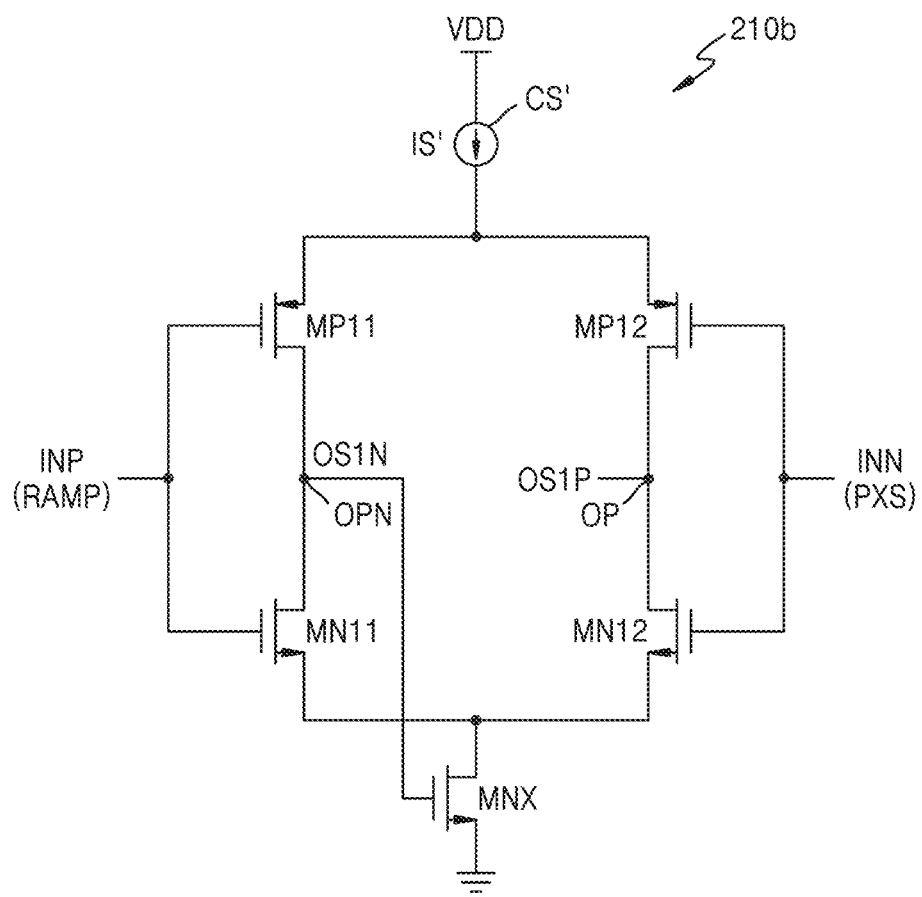
FIG. 7 is a circuit diagram illustrating an example of the first comparator included in the ADC according to some example embodiments.

FIG. 7 is a circuit diagram illustrating a first comparator 210b as an example that may be included in the ADC 130 according to some example embodiments. A first output signal OS1P shown in FIG. 7 may be the same as the output signal OS1P shown in FIG. 2.

Referring to FIG. 7, the first comparator 210b may include a plurality of transistors MP11, MP12, MN11, MN12, and MNX, and a current source CS'. The first comparator 210b may include a first P-type transistor MP11, a second P-type transistor MP12, a first N-type transistor MN11, a second N-type transistor MN12, and a transistor MNX. The transistor MNX may be an N-type transistor. The first comparator 210b may be referred to as an OTA having a 6T structure.

In some example embodiments, the current source CS' may be implemented with a PMOS transistor, that is, a P-type MOSFET. The current source CS' may be connected to power supply voltage VDD and may generate bias current IS'.

A gate of the first N-type transistor MN11 and a gate of the first P-type transistor MP11 may receive a first input signal INP, and a gate of the second N-type transistor MN12 and a gate of the second P-type transistor MP12 may receive a second input signal INN.

A source of the first P-type transistor MP11 and a source of the second P-type transistor MP12 may be connected to the current source CS'. A drain of the first P-type transistor MP11 may be connected to a second output node OPN, and a drain of the second P-type transistor MP12 may be connected to a first output node OP.

A source of the first N-type transistor MN11 and a source of the second N-type transistor MN12 may be connected to a first node (for example, a drain) of the transistor MNX, and ground voltage may be applied to a second node (for example, a source) of the transistor MNX. A drain of the first N-type transistor MN11 may be connected to the second output node OPN, and a drain of the second N-type transistor MN12 may be connected to the first output node OP.

The first comparator 210b may further include a plurality of switching circuits. Each of the switching circuits may switch between an input node to which the second input signal INN is input and a first output node OP to which the first output signal OS1P is output, or may switch between an input node to which the first input signal INP is input and the second output node OPN to which a second output signal OS1N is output. When the switching circuits are turned on, the input node to which the second input signal INN is input may be connected to the first output node OP to which the first output signal OS1P is output, and the input node to which the first input signal INP is input may be connected to the second output node OPN to which the second output signal OS1N is output.

Figure 8A:
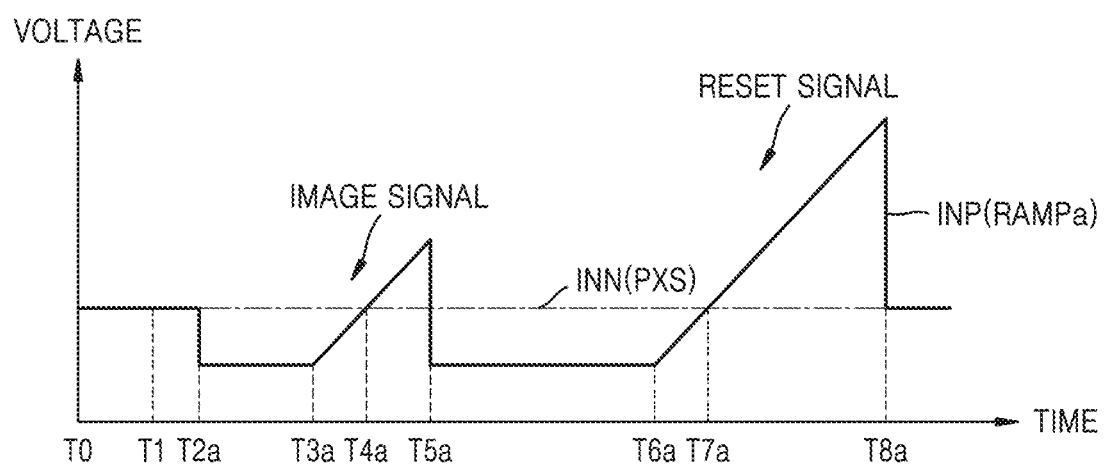
FIGS. 8A and 8B are timing diagrams illustrating signals input to a comparison circuit of the first comparator shown in FIG. 7 to explain an operation of the ADC shown in FIG. 2.
Figure 8B:
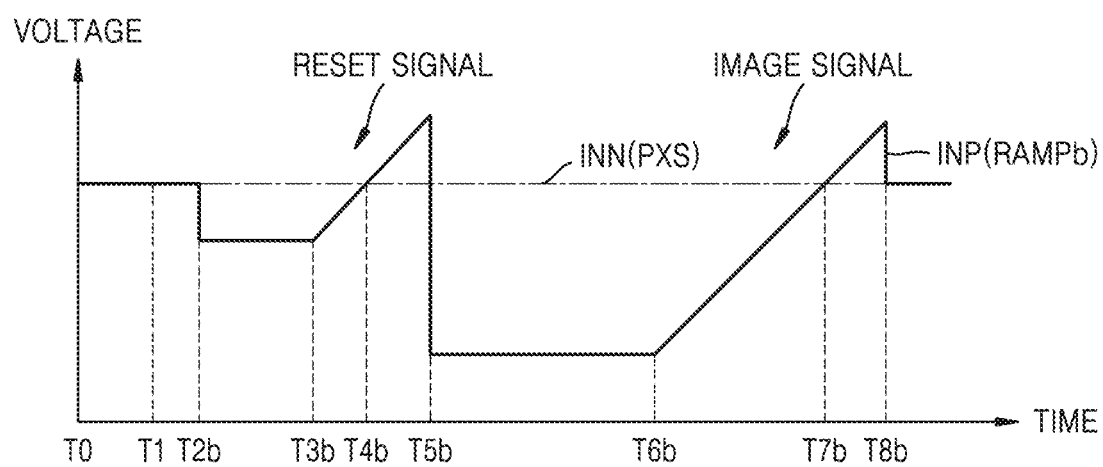

FIGS. 8A and 8B are timing diagrams illustrating signals input to a comparison circuit including the first comparator 210a shown in FIG. 7 to explain an operation of the column parallel ADC 131 shown in FIG. 2. FIGS. 8A and 8B illustrate examples of the ramp signal RAMP described with reference to FIG. 1 to explain an operation of the first comparator 210a when the comparator 210a receives first and second ramp signals that are reverse ramp signals.

Referring to FIGS. 2 and 8A, for digital conversion of an image signal, an offset may be applied to a ramp signal RAMPa at time T2a, and then the ramp signal RAMPa may increase during a period from time T3a to time T5a. A counter 151 may count a counting clock signal CNT during a period from time T3a to time T4a (zero-crossing time) at which the voltage level of the ramp signal RAMPa is equal to the voltage level of a pixel signal PXS.

After the digital conversion of the image signal is completed, an offset may be applied again to the ramp signal RAMPa in a period from time T5a to time T6a. To convert a reset signal into a digital signal, the ramp signal RAMPa may increase from time T6a to time T8a. The counter 151 may count the counting clock signal CNT during a period from time T6a to time T7a at which the voltage level of the ramp signal RAMPa is equal to the voltage level of the pixel signal PXS.

Referring to FIGS. 2 and 8B, for digital conversion of a reset signal, a first offset may be applied to a ramp signal RAMPb at time T2b, and then the ramp signal RAMPb may increase during a period from time T3b to time T5b. The counter 151 may count a counting clock signal CNT during a period from time T3b to time T4b (zero-crossing time) at which the voltage level of the ramp signal RAMPb is equal to the voltage level of a pixel signal PXS.

After the digital conversion of the reset signal is completed, a second offset may be applied to the ramp signal RAMPb in a period from time T5b to time T6b. In this case, the voltage level of the ramp signal RAMPb at time T5b at which the second offset is applied may be lower than the voltage level of the ramp signal RAMPb at time T2b at which the first offset is applied.

To convert an image signal into a digital signal, the ramp signal RAMPb may increase during a period from time T6b to time T8b. The counter 151 may count the counting clock signal CNT during a period from time T6b to time T7b at which the voltage level of the ramp signal RAMPb is equal to the voltage level of the pixel signal PXS.

Figure 9:
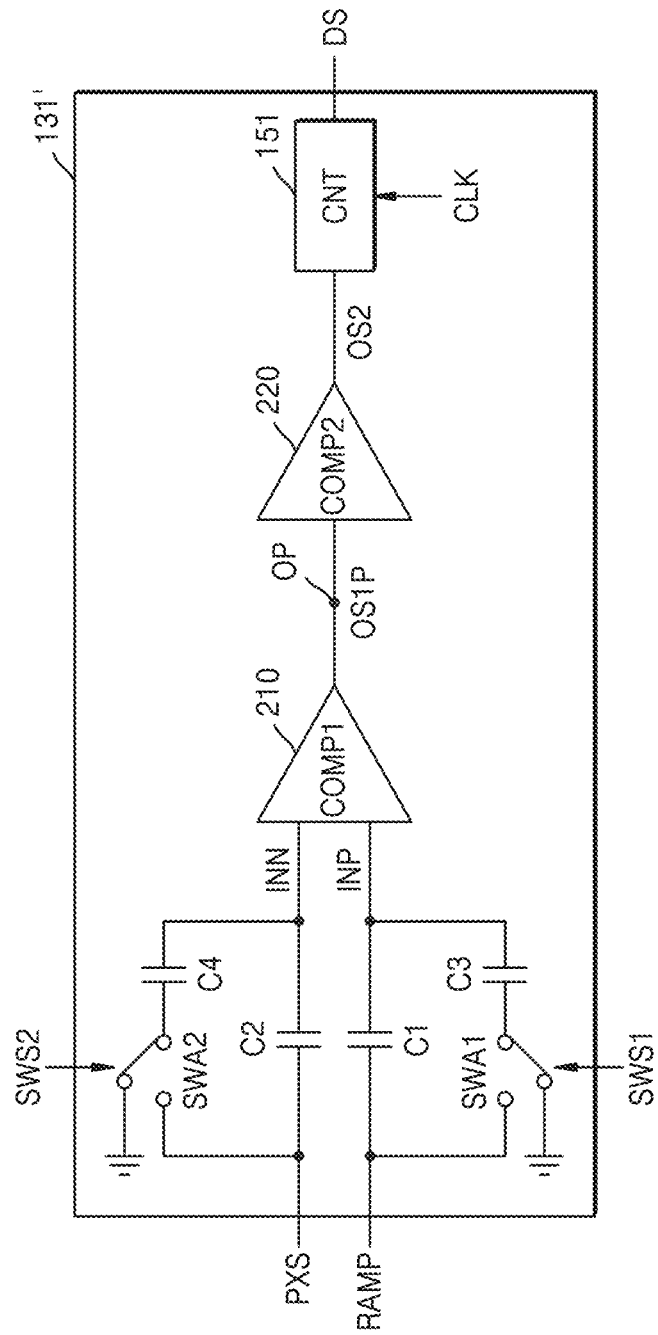
FIG. 9 is a block diagram illustrating the ADC of the image sensor according to some example embodiments.

FIG. 9 is a block diagram illustrating a column parallel ADC 131' that may be included in the image sensor 100 according to some example embodiments. In FIGS. 9 and 2, like reference numerals denote like elements, and overlapping descriptions thereof will be omitted.

Referring to FIG. 9, the column parallel ADC 131' may include a first comparator 210, a second comparator 220, a counter 151, first to fourth capacitors C1, C2, C3, and C4, and switching circuits SWA1 and SWA2. The ADC 30 described with reference to FIG. 1 may include a plurality of column parallel ADCs 131'. The first comparator 210 may be one of the first comparators 210, 210a, and 210b described with reference to FIGS. 3, 4, and 7.

The first capacitor C1 may be connected to a first input node of the first comparator 210, and the first comparator 210 may receive a ramp signal RAMP through the first capacitor C1 as a first input signal INP. The second capacitor C2 may be connected to a second input node of the first comparator 210, and the first comparator 210 may receive a pixel signal PXS through the second capacitor C2 as a second input signal INN.

According to a switching operation of the first switching circuit SWA1, the third capacitor C3 may be connected in parallel to the first capacitor C1. The first switching circuit SWA1 may connect a node of the third capacitor C3 to a node of the first capacitor C1 or ground voltage in response to a first switching signal SWS1. Therefore, the capacitance of capacitors connected to the first input node of the first comparator 210 may vary according to the switching operation of the first switching circuit SWA1.

In addition, according to a switching operation of the second switching circuit SWA2, the fourth capacitor C4 may be connected in parallel to the second capacitor C2. The second switching circuit SWA2 may connect a node of the fourth capacitor C4 to a node of the second capacitor C2 or ground voltage in response to a second switching signal SWS2. Therefore, the capacitance of capacitors connected to the second input node of the first comparator 210 may vary according to the switching operation of the second switching circuit SWA2. The first switching signal SWS1 and the second switching signal SWS2 may be received from the timing generator 170 (refer to FIG. 1).

The timing generator 170 (e.g., from FIG. 1) may provide the first switching signal SWS1 and the second switching signal SWS2 to the column parallel ADC 131' according to the analog gain of the first comparator 210. For example, in a high-illuminance environment, the timing generator 170 may relatively decrease the analog gain (for example, about 1 time to about 1.99 times). In this case, the timing generator 170 may attenuate the first input signal INP and the second input signal INN by generating the first switching signal SWS1 and the second switching signal SWS2 to connect a node of the first switching circuit SWA1 and a node of the second switching circuit SWA2 to ground voltage. Conversely, for example, in a low-illumination environment, the timing generator 170 may relatively increase the analog gain (for example, about 2 times to about 16 times). In this case, the timing generator 170 may generate the first switching signal SWS1 to connect the first capacitor C1 and the third capacitor C3 in parallel to each other, and the second switching signal SWS2 to connect the second capacitor C2 and the fourth capacitor C4 in parallel to each other.

Figure 10:
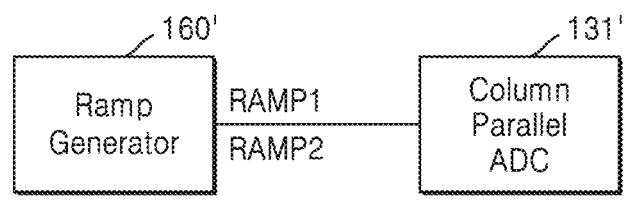
FIG. 10 is a diagram illustrating ramp signals provided to the ADC of the image sensor according to some example embodiments.
Figure 11:
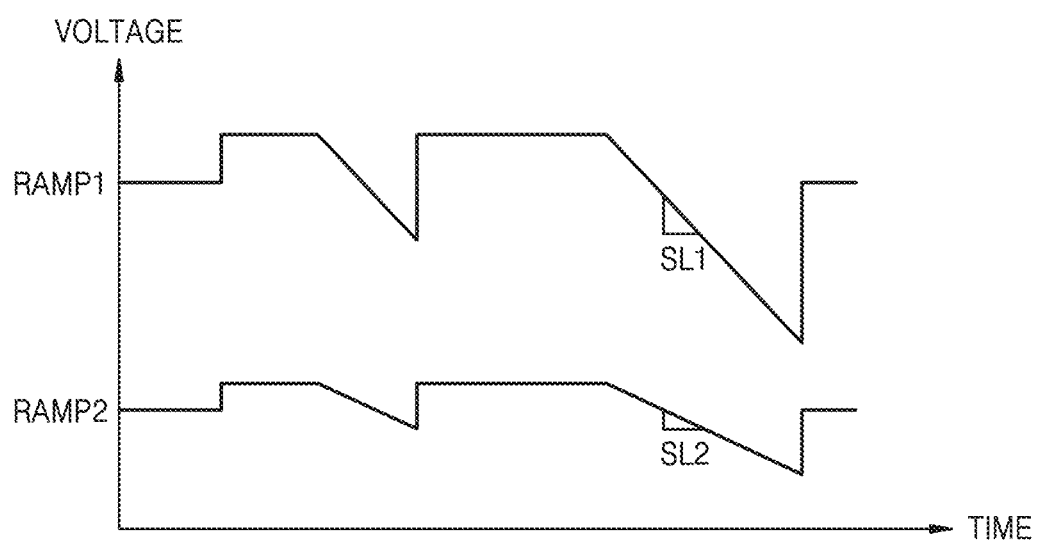
FIG. 11 is a diagram illustrating ramp signals provided to the ADC according to some example embodiments.

FIG. 10 is a diagram illustrating ramp signals provided to the column parallel ADC 131' that may be included in the image sensor 100 according to some example embodiments. FIG. 11 is a diagram illustrating ramp signals provided to the column parallel ADC 131' according to some example embodiments.

Referring to FIGS. 9 to 11, a ramp generator 160' may generate a first ramp signal RAMP1 and/or a second ramp signal RAMP2. In some example embodiments, the ramp generator 160' may include a current source and a resistor, and may generate the first ramp signal RAMP1 or the second ramp signal RAMP2 by varying the amount of current output from the current source or the resistance of the resistor. Alternatively, in some example embodiments, the ramp generator 160' may include a first ramp generator configured to generate the first ramp signal RAMP1 and a second ramp generator configured to the second ramp signal RAMP2.

The first ramp signal RAMP1 and the second ramp signal RAMP2 may have different slopes in a period in which an image signal and a reset signal are sampled. For example, a slope SL1 of the first ramp signal RAMP1 may be greater than a slope SL2 of the second ramp signal RAMP2.

The image sensor 100 of the inventive concepts may adjust the gain of ramp voltage according to external environments. The "gain" of ramp voltage may refer to the degree of amplification of a signal. That is, the greater the slope of ramp voltage, the smaller the gain; and the smaller the slope of ramp voltage, the greater the gain. As the slope of ramp voltage increases, the number of times that the counter 151 counts may decrease, and thus the magnitude of a digital signal DS may decrease. Conversely, as the slope of ramp voltage decreases, the number of times that the counter 151 counts may increase, and thus the magnitude of a digital signal DS may increase.

Therefore, in a high-illuminance environment, the first ramp signal RAMP1 having a relatively small gain may be provided to the column parallel ADC 131'. When the first ramp signal RAMP1 is provided to the column parallel ADC 131', a node of the switching circuit SWA1 and a node of the second switching signal SWA2 may be connected to ground voltage to attenuate the first input signal INP and the second input signal INN Conversely, in a low-illumination environment, the second ramp signal RAMP2 having a relatively great gain may be provided to the column parallel ADC 131'. When the second ramp signal RAMP2 is provided to the column parallel ADC 131', the first capacitor C1 and the third capacitor C3 may be connected in parallel to each other, and the second capacitor C2 and the fourth capacitor C4 may be connected in parallel to each other.

Figure 12:
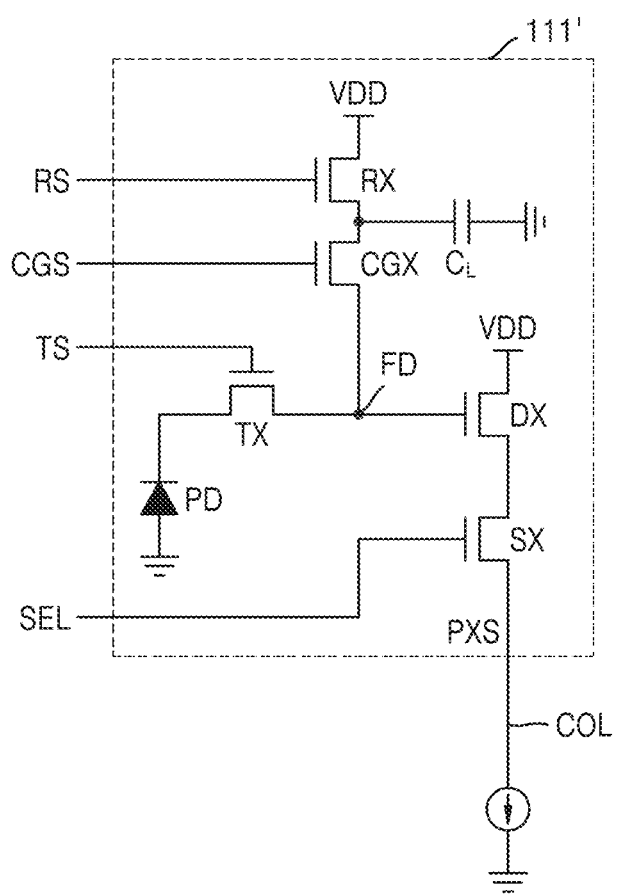
FIG. 12 is a circuit diagram illustrating a pixel according to some example embodiments.

FIG. 12 is a circuit diagram illustrating of a pixel according to some example embodiments. In FIGS. 12 and 2, like reference numerals denote like elements, and overlapping descriptions thereof will be omitted.

Referring to FIG. 12, a pixel 111' may include a photodiode PD, a transfer transistor TX, a floating diffusion node FD, a reset transistor RX, a drive transistor DX, and a selection transistor SX. In addition, the pixel 111' may include a gain control transistor CGX (also referred to as a conversion gain control transistor CGX) and a capacitor $C_L$. The gain control transistor CGX may operate in response to a gain control signal CGS. The capacitor $C_L$ may be a passive capacitor having a fixed or variable capacitance, a capacitor formed by or connected to a source/drain of the gain control transistor CGX, or a parasitic capacitor formed by another capacitor that may be connected to the source/drain of the gain control transistor CGX.

The photodiode PD may generate charge according to the intensity of light, and thus the amount of charge generated by the photodiode PD may vary depending on an image capturing environment (e.g., low-illumination or high-illumination environments). For example, in a high-illumination environment, the amount of charge generated by the photodiode PD may reach the full well capacity (FWC) of the photodiode PD. However, in a low-illumination environment, the amount of charge generated by the photodiode PD may not reach the FWC of the photodiode PD.

The reset transistor RX may be turned on in response to a reset control signal RS applied to a gate of the reset transistor RX to reset a floating diffusion node FD based on power supply voltage VDD. In this case, the gain control transistor CGX may be turned on together with the reset transistor RX in response to a gain control signal CGS received through a gate of the gain control transistor CGX, and thus the power supply voltage VDD may be applied to the floating diffusion node FD to reset the floating diffusion node FD.

The transfer transistor TX may be turned on in response to a transfer control signal TS applied to a gate of the transfer transistor TX to transfer charge generated by the photodiode PD to the floating diffusion node FD, and thus charge may accumulate in the floating diffusion node FD. That is, a parasitic capacitor may be formed at the floating diffusion node FD, and charge may accumulate in the parasitic capacitor formed by the floating diffusion node FD. In addition, when the conversion control transistor CGX is turned on, charge may accumulate in the parasitic capacitor formed by the floating diffusion node FD and the capacitor $C_L$.

Charge accumulated in the floating diffusion node FD may be converted into voltage. A conversion gain (the unit of conversion gain may be, for example, μV/e) is determined by the capacitance of the floating diffusion node FD and may be in inverse proportion to the capacitance of the floating diffusion node FD. When the capacitance of the floating diffusion node FD increases, the conversion gain may decrease, and when the capacitance of the floating diffusion node FD decreases, the conversion gain may increase.

The gain control transistor CGX may be turned on or off based on the gain control signal CGS received through the gate of the gain control transistor CGX. When the gain control transistor CGX is turned on, the capacitor $C_L$ is connected to the floating diffusion node FD, and the floating diffusion node FD has parasitic capacitance and capacitance caused by the capacitor $C_L$ such that the total capacitance may increase. A conversion gain when the gain control transistor CGX is turned off may be greater than a conversion gain when the gain control transistor CGX is turned on. A state in which the gain control transistor CGX is turned off may be referred to as a high conversion gain (HCG) mode, and a state in which the gain control transistor CX is turned on may be referred to as a low conversion gain (LCG) mode.

As described above, the pixel 111' may operate in one of the HCG mode and the LCG mode depending on whether the gain control transistor CGX is turned on or off. In a low-illumination condition, the HCG mode may be selected, and thus the low-light detection performance of the image sensor 100 may be improved. In addition, the LCG mode may be selected in a high-illumination condition. In this case, the capacitance of the floating diffusion node FD of the pixel 111' is large, and thus FWC may increase. Therefore, the high-light detection performance of the image sensor 100 may be improved.

As described above, the pixel 111' has a dual conversion gain (DCG) to sense low-intensity light and high-intensity light, and thus the operation range (e.g., a dynamic range) of the image sensor 100 may widen (or increase) based on an operating mode. In some example embodiments, the pixel 111' may continuously operate in the HCG mode and the LCG mode during a readout period, and thus a processor receiving image data IDTA (refer to FIG. 1) from the image sensor 100 (refer to FIG. 1) may merge a first image obtained in the HCG mode and a second image obtained in the LCG mode to generate an image having a high dynamic range HDR. The pixel 111' having a DCG and shown in FIG. 12 is merely an example, and the configuration of pixels may be modified in various ways.

Referring to FIGS. 9 and 12, in a high-illuminance environment, the pixel 111' may operate in the LCG mode, and a node of the first switching circuit SWA1 and a node of the second switching circuit SWA2 may be connected to ground voltage to attenuate a first input signal INP and a second input signal INN. Furthermore, in a low-illumination environment, the pixel 111' may operate in the HCG mode in which the first capacitor C1 and the third capacitor C3 are connected in parallel to each other, and the second capacitor C2 and the fourth capacitor C4 are connected in parallel to each other.

Figure 13:
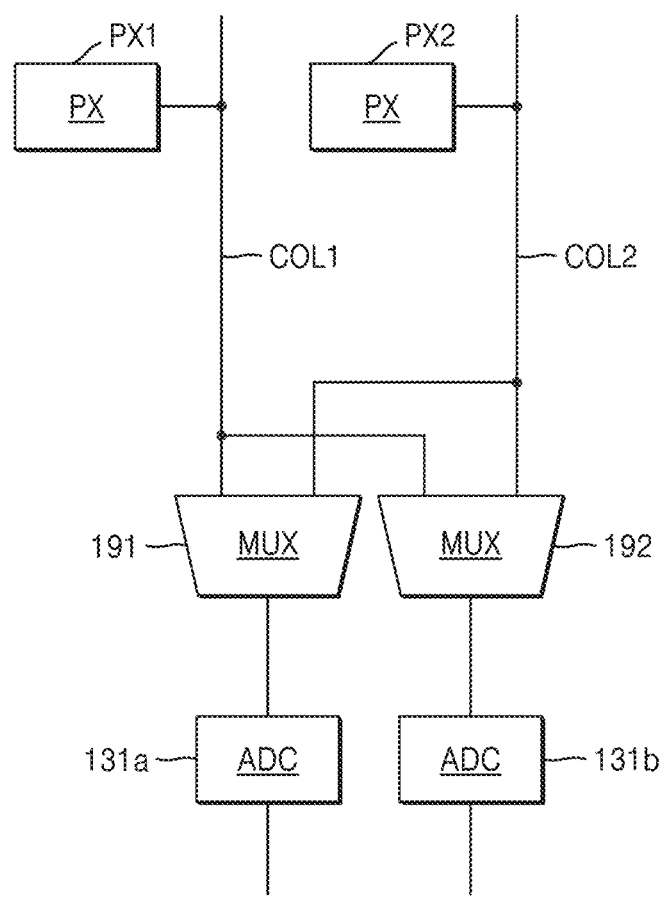
FIG. 13 is a block diagram illustrating the image sensor according to some example embodiments.

FIG. 13 is a block diagram illustrating the image sensor 100 according to some example embodiments.

Referring to FIGS. 1 and 13, the image sensor 100 (refer to FIG. 1) may further include multiplexers MUX. The multiplexers MUX may connect a plurality of column lines COL to the ADC 130. The column lines COL may include a first column line COL1 and a second column line COL2, and the column parallel ADCs 131 may include a first column parallel ADC 131a and a second column parallel ADC 131b.

For example, a first multiplexer 191 may connect the first column line COL1 to the first column parallel ADC 131a and may connect the second column line COL2 to the first column parallel ADC 131a. In addition, for example, a second multiplexer 192 may connect the second column line COL2 to the second column parallel ADC 131b and may connect the first column line COL1 to the second column parallel ADC 131b. The first column parallel ADC 131a and the second column parallel ADC 131b may each include at least one selected from the group consisting of the first comparator 210 described with reference to FIG. 3, the first comparator 210a described with reference to FIG. 4, and the first comparator 210b described with reference to FIG. 7.

The first column parallel ADC 131*a* and the second column parallel ADC 131*b* may be the same as the column parallel ADC 131 described with reference to FIG. 2 or the column parallel ADC 131' described with reference to FIG. 9.

The first multiplexer 191 and the second multiplexer 192 may differently connect the first column line COL1 and the second column line COL2 to the first column parallel ADC 131*a* and the second column parallel ADC 131*a* according to a mode-change signal. For example, the first multiplexer 191 and the second multiplexer 192 may connect the first column line COL1 to the first column parallel ADC 131*a*, and may connect the second column line COL2 to the second column parallel ADC 131*b*.

Alternatively, for example, the first column line COL1 and the second column line COL2 may be connected to one column parallel ADC (one of the first column parallel ADC 131*a* and the second column parallel ADC 131*a*) for an analog binning operation.

Alternatively, for example, to obtain an HDR, the first multiplexer 191 and the second multiplexer 192 may connect the first column line COL1 to the first column parallel ADC 131*a* and the second column parallel ADC 131*b* in a first period, and may then connect the second column line COL2 to the first column parallel ADC 131*a* and the second column parallel ADC 131*a* in a second period. In this case, different ramp signals (for example, ramp signals having different slopes) may be respectively input to the first column parallel ADC 131*a* and the second column parallel ADC 131*a*. The image sensor 100 may obtain one piece of image data by combining data generated in the first period with data generated in the second period.

Figure 14:
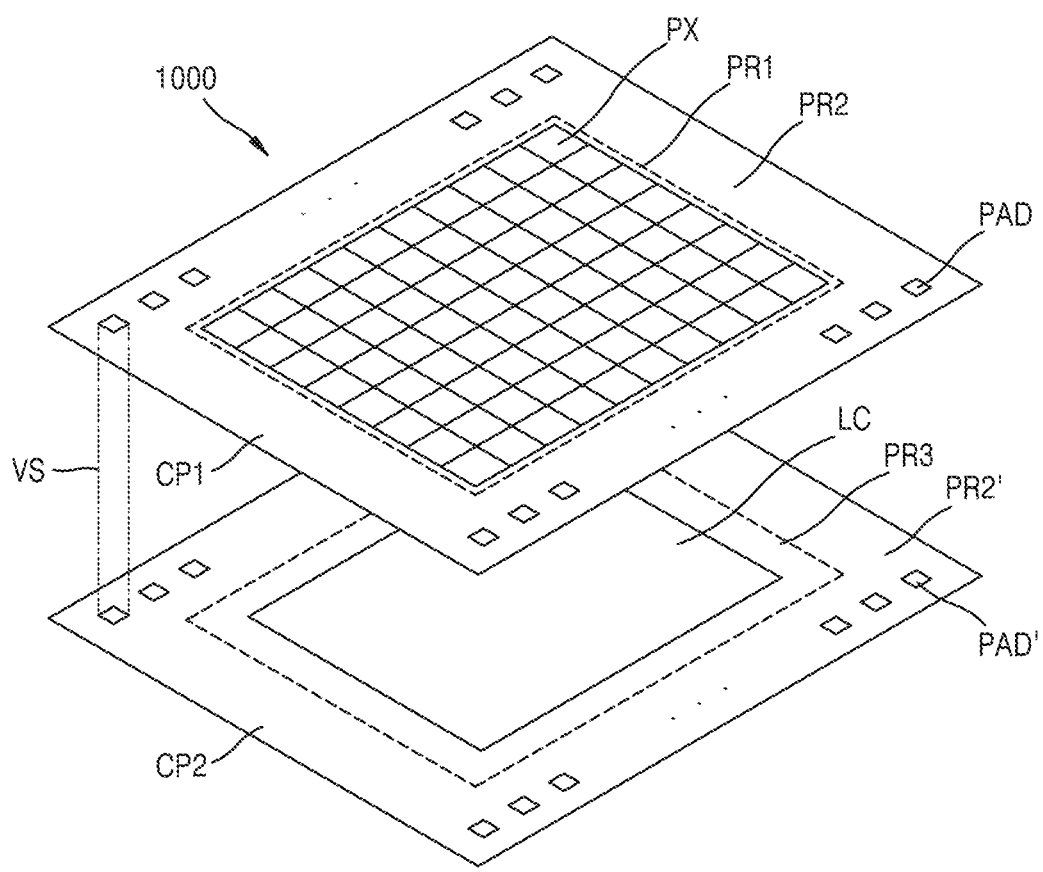
FIG. 14 is a schematic diagram illustrating an image sensor according to some example embodiments.

FIG. 14 is a schematic diagram illustrating an image sensor 1000 according to some example embodiments.

Referring to FIG. 14, the image sensor 1000 may be a stack-type image sensor including a first chip CP1 and a second chip CP2 that are stacked in a vertical direction. The image sensor 1000 may be an example of the image sensor 100 described with reference to FIG. 1 and other drawings.

The first chip CP1 may include a pixel region PR1 and a pad region PR2, and the second chip CP2 may include a peripheral circuit region PR3 and a lower pad region PR2'. A pixel array in which a plurality of pixels PX are arranged may be formed in the pixel region PR1. Each of the pixels PX may be the same as the pixel 111 described with reference to FIG. 2 or the pixel 111' described with reference to FIG. 12.

The peripheral circuit region PR3 of the second chip CP2 may include a logic circuit block LC and may include a plurality of transistors. For example, the logic circuit block LC may include at least one selected from the group consisting of the row driver 120, the ADC 130, the ramp generator 160, the timing generator 170, and the buffer 180 described with reference to FIG. 1.

The lower pad region PR2' of the second chip CP2 may include a lower conductive pad PAD'. A plurality of lower conductive pads PAD' may be provided, and the lower conductive pads PAD' may respectively correspond to upper conductive pads PAD. The lower conductive pads PAD' may be electrically connected to the upper conductive pads PAD of the first chip CP1 through via-structures VS.

The image sensor 1000 may further include a memory. The memory may be provided in the second chip CP2. However, embodiments are not limited thereto. Unlike in the example embodiments shown in FIG. 14, the memory may be provided in a third chip separate from the first chip CP1 and the second chip CP2, and the first chip CP1, the second chip CP2, and the third chip may be stacked.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The image sensor 100 (or other circuitry, for example, pixel array 110, row driver 120, ADC 130, ramp generator 160, 160' timing generator 170, buffer 180, column parallel ADC 131, 131', comparison circuit 141, counter 151, first comparator 210, second comparator 220, chip CP1, chip CP2, and other sub components thereof) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. An analog-digital converting circuit comprising:
a counter; and
a comparator comprising:
    a first P-type transistor comprising a gate connected to a first input node of the comparator;
    a second P-type transistor comprising a gate connected to a second input node of the comparator;
    a first N-type transistor comprising a gate connected to the first input node and a drain connected to the first P-type transistor;
    a second N-type transistor comprising a gate connected to the second input node and a drain connected to the second P-type transistor; and
    a transistor comprising a gate connected to the drain of the first N-type transistor and a source to which ground voltage or power supply voltage is applied.

2. The analog-digital converting circuit of claim 1, wherein the comparator further comprises a switching circuit connected between the first input node and the drain of the first N-type transistor.

3. The analog-digital converting circuit of claim 1, wherein the comparator further comprises a current source connected to a source of the first N-type transistor and a source of the second N-type transistor.

4. The analog-digital converting circuit of claim 1, wherein
    the source of the transistor is connected to the ground voltage,
    a drain of the transistor is connected to a source of the first N-type transistor and a source of the second N-type transistor, and
    the transistor is an N-type transistor.

5. The analog-digital converting circuit of claim 4, wherein the comparator further comprises a current source connected to a source of the first P-type transistor and a source of the second P-type transistor.

6. The analog-digital converting circuit of claim 4, wherein a signal input to the first input node of the comparator is a ramp signal that increases according to a specific slope.

7. The analog-digital converting circuit of claim 1, further comprising:
   a first capacitor connected to the first input node of the comparator;
   a second capacitor connected to the second input node of the comparator;
   a third capacitor connected to a node of the first capacitor;
   a fourth capacitor connected to a node of the second capacitor;
   a first switching circuit configured to connect a node of the third capacitor to ground or another node of the first capacitor; and
   a second switching circuit configured to connect a node of the fourth capacitor to the ground or another node of the second capacitor.

8. An image sensor comprising:
   a pixel array comprising a plurality of pixels;
   a ramp generator configured to generate a ramp signal; and
   an analog-digital converting circuit configured to convert a pixel signal output from the pixel array into a digital signal, the analog-digital converting circuit comprising a comparator and a counter, the comparator comprising
   a first P-type transistor comprising a gate connected to a first input node of the comparator, the first input node receiving the ramp signal;
   a second P-type transistor comprising a gate connected to a second input node of the comparator, the second input node receiving the pixel signal;
   a first N-type transistor comprising a gate connected to the first input node;
   a second N-type transistor comprising a gate connected to the second input node; and
   a transistor comprising a gate connected to a drain of the first N-type transistor and a source to which ground voltage or power supply voltage is applied.

9. The image sensor of claim 8, wherein the comparator further comprises:
   a first switching circuit connected between the first input node and the drain of the first N-type transistor; and
   a first switching circuit connected between the second input node and a drain of the second N- type transistor.

10. The image sensor of claim 8, wherein
    the source of the transistor is connected to the power supply voltage,
    a drain of the transistor is connected to a source of the first P-type transistor, and
    the transistor is a P-type transistor.

11. The image sensor of claim 8, wherein
    the source of the transistor is connected to the ground voltage,
    a drain of the transistor is connected to a source of the first N-type transistor, and
    the transistor is an N-type transistor.

12. The image sensor of claim 8, wherein the analog-digital converting circuit further comprises:
    a first capacitor connected to the first input node of the comparator;
    a second capacitor connected to the second input node of the comparator;
    a third capacitor connected to a node of the first capacitor;
    a fourth capacitor connected to a node of the second capacitor;
    a first switching circuit configured to connect a node of the third capacitor to ground or another node of the first capacitor; and
    a second switching circuit configured to connect a node of the fourth capacitor to the ground or another node of the second capacitor.

13. The image sensor of claim 12, wherein,
    in a high-illuminance environment, the first switching circuit is configured to connect the node of the third capacitor to the ground, and the second switching circuit is configured to connect the node of the fourth capacitor to the ground, and
    in a low-illumination environment, the first switching circuit is configured to connect the node of the third capacitor to the other node of the first capacitor, and the second switching circuit is configured to connect the node of the fourth capacitor to the other node of the second capacitor.

14. An image sensor comprising:
    a pixel array comprising a plurality of pixels connected to a plurality of column lines;
    a ramp generator configured to generate a ramp signal; and
    a plurality of analog-digital converting circuits each comprising a first comparator and a second comparator that are configured to generate a comparison result signal by comparing a pixel signal output through a corresponding column line among the plurality of column lines with the ramp signal, the first comparator comprising
    a first P-type transistor and a first N-type transistor that receive the ramp signal;
    a second P-type transistor and a second N-type transistor that receive the pixel signal;
    a first output node through which results of the comparing of the pixel signal with the ramp signal are output as a first output signal;
    a second output node through which a second output signal is output; and
    a transistor comprising a gate connected to the second output node and a source to which ground voltage or power supply voltage is applied.

15. The image sensor of claim 14, wherein
    the transistor is a P-type transistor, and the source of the transistor is connected to the power supply voltage, and
    the first comparator further comprises a current source connected to the first N-type transistor and the second N-type transistor.

16. The image sensor of claim 14, wherein
    the transistor is an N-type transistor, and the source of the transistor is connected to the ground voltage, and
    the first comparator further comprises a current source connected to the first P-type transistor and the second P-type transistor.

17. The image sensor of claim 14, wherein each of the plurality of analog-digital converting circuits further comprises:
    a first capacitor connected to a first input node of the first comparator, the first input node configured to receive the ramp signal;
    a second capacitor connected to a second input node of the first comparator, the second input node configured to receive the pixel signal;

a third capacitor connected to a node of the first capacitor;
a fourth capacitor connected to a node of the second capacitor;
a first switching circuit configured to connect a node of the third capacitor to ground or another node of the first capacitor; and
a second switching circuit configured to connect a node of the fourth capacitor to the ground or another node of the second capacitor.

18. The image sensor of claim 17, wherein
the ramp generator is configured to generate a first ramp signal and a second ramp signal, and
a slope of the first ramp signal is greater than a slope of the second ramp signal.

19. The image sensor of claim 18, wherein
based on each of the plurality of analog-digital converting circuits receiving the first ramp signal, the first switching circuit is configured to connect the node of the third capacitor to the ground, and the second switching circuit is configured to connect the node of the fourth capacitor to the ground,
based on each of the plurality of analog-digital converting circuits receiving the second ramp signal, the first switching circuit is configured to connect the node of the third capacitor to the other node of the first capacitor, and the second switching circuit is configured to connect the node of the fourth capacitor to the other node of the second capacitor.

20. The image sensor of claim 14, further comprising a multiplexer configured to connect the plurality of column lines to the plurality of analog-digital converting circuits,
wherein the plurality of analog-digital converting circuits comprise a first analog-digital converting circuit and a second analog-digital converting circuit, and
wherein the multiplexer is configured to connect at least one of a first column line and a second column line of the plurality of column lines to the first analog-digital converting circuit, and connect at least one of the first and second column lines of the plurality of column lines to the second analog-digital converting circuit.

* * * * *